(12) United States Patent
Hung et al.

(10) Patent No.: US 12,062,696 B2
(45) Date of Patent: Aug. 13, 2024

(54) MANUFACTURING METHOD OF SEMICONDUCTOR DEVICE

(71) Applicant: Taiwan Semiconductor Manufacturing Company, Ltd., Hsinchu (TW)

(72) Inventors: Yi-Tse Hung, Hsinchu (TW); Ang-Sheng Chou, Hsinchu (TW); Hung-Li Chiang, Taipei (TW); Tzu-Chiang Chen, Hsinchu (TW); Chao-Ching Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/352,249

(22) Filed: Jul. 14, 2023

(65) Prior Publication Data

US 2023/0361177 A1    Nov. 9, 2023

Related U.S. Application Data

(62) Division of application No. 17/351,244, filed on Jun. 18, 2021, now Pat. No. 11,749,718.

(Continued)

(51) Int. Cl.
*H01L 29/78*   (2006.01)
*H01L 23/36*   (2006.01)
(Continued)

(52) U.S. Cl.
CPC .......... *H01L 29/1033* (2013.01); *H01L 23/36* (2013.01); *H01L 29/0607* (2013.01);
(Continued)

(58) Field of Classification Search
CPC . H01L 29/1033; H01L 23/36; H01L 29/0607; H01L 29/0669; H01L 29/66477;
(Continued)

(56) References Cited

U.S. PATENT DOCUMENTS

2015/0303299 A1* 10/2015 Chang ............... H01L 21/02568
257/29
2016/0141427 A1* 5/2016 Chen ................. H01L 29/78681
257/349

(Continued)

FOREIGN PATENT DOCUMENTS

KR    20180069671    6/2018

OTHER PUBLICATIONS

"Office Action of Korea Counterpart Application", issued on Dec. 20, 2023, p. 1-p. 8.

*Primary Examiner* — Sheikh Maruf
(74) *Attorney, Agent, or Firm* — JCIPRNET

(57) ABSTRACT

A semiconductor device and a manufacturing method thereof are provided. The semiconductor device includes a heat transfer layer disposed over a substrate, a channel material layer, a gate structure and source and drain terminals. The channel material layer has a first surface and a second surface opposite to the first surface, and the channel material layer is disposed on the heat transfer layer with the first surface in contact with the heat transfer layer. The gate structure is disposed above the channel material layer. The source and drain terminals are in contact with the channel material layer and located at two opposite sides of the gate structure.

20 Claims, 10 Drawing Sheets

Related U.S. Application Data

(60) Provisional application No. 63/156,932, filed on Mar. 5, 2021.

(51) Int. Cl.
  *H01L 29/06* (2006.01)
  *H01L 29/10* (2006.01)
  *H01L 29/66* (2006.01)

(52) U.S. Cl.
  CPC .... *H01L 29/0669* (2013.01); *H01L 29/66477* (2013.01); *H01L 29/78* (2013.01)

(58) Field of Classification Search
  CPC . H01L 29/78; H01L 23/3731; H01L 23/3738; H01L 29/0657; H01L 29/24; H01L 29/66969; H01L 29/778; H01L 29/786; H01L 51/0048; H01L 23/367; H01L 23/373; H01L 29/78696; H01L 29/78606; H01L 29/78618

USPC .......................................................... 257/288
See application file for complete search history.

(56) References Cited

U.S. PATENT DOCUMENTS

| | | | |
|---|---|---|---|
| 2017/0098717 A1* | 4/2017 | Yeh | H01L 21/84 |
| 2018/0005824 A1* | 1/2018 | Lin | H01L 29/78681 |
| 2018/0068851 A1* | 3/2018 | Lin | H01L 29/778 |
| 2018/0151752 A1* | 5/2018 | Lin | H01L 29/24 |
| 2018/0269291 A1* | 9/2018 | Lin | H01L 21/02485 |
| 2020/0006541 A1* | 1/2020 | Lin | H01L 29/66969 |
| 2020/0343273 A1* | 10/2020 | Huang | H01L 21/02527 |
| 2021/0134992 A1* | 5/2021 | Lu | H01L 29/66969 |
| 2021/0265501 A1* | 8/2021 | Hung | H01L 21/76897 |
| 2021/0305046 A1* | 9/2021 | Li | H01L 21/02381 |
| 2022/0278196 A1* | 9/2022 | Kuang | H01L 29/66439 |

\* cited by examiner

MANUFACTURING METHOD OF SEMICONDUCTOR DEVICE

CROSS-REFERENCE TO RELATED APPLICATION

This application is a divisional application and claims the priority benefit of U.S. patent application Ser. No. 17/351,244, filed on Jun. 18, 2021, which claims the priority benefit of U.S. provisional application Ser. No. 63/156,932, filed on Mar. 5, 2021. The entirety of the above-mentioned patent applications is hereby incorporated by reference herein and made a part of this specification.

BACKGROUND

Shrinking sizes and high integration density of semiconductor devices make the heat dissipation challenging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
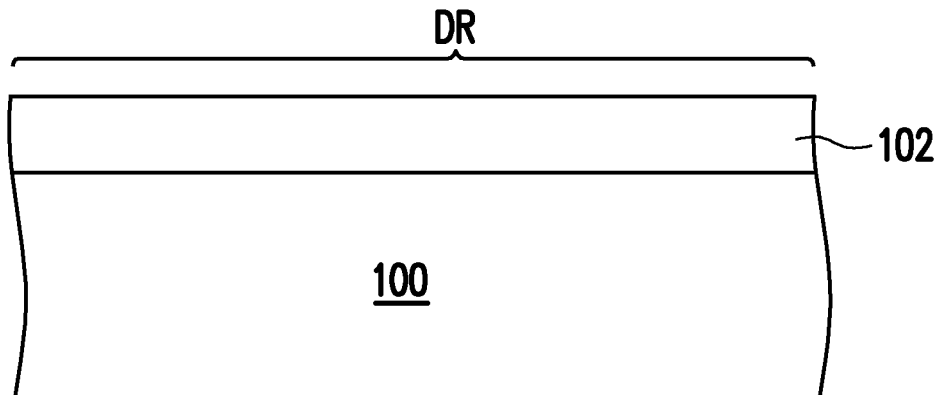
FIG. 1 to FIG. 9 are schematic views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The embodiments are intended to provide further explanations but are not used to limit the scope of the present disclosure. The specific embodiment(s) described herein is related to a structure containing one or more semiconductor devices, and is not intended to limit the scope of the present disclosure. Embodiments of the present disclosure describe the exemplary manufacturing process of the structure(s) formed with one or more semiconductor devices such as transistors and the integration structures fabricated there-from. Certain embodiments of the present disclosure are related to the structures including semiconductor transistors and other elements. The substrates and/or wafers may include one or more types of integrated circuits or electronic components therein. The semiconductor device(s) may be formed on a bulk semiconductor substrate or a silicon/germanium-on-insulator substrate.

FIG. 1 through FIG. 9 are schematic views of various stages in a manufacturing method of a semiconductor device in accordance with some embodiments of the disclosure. From FIG. 1 through FIG. 7 and FIG. 9, schematic cross-section views of a device region DR of the structure are shown, while in FIG. 8, a schematic top view of the structure is shown.

Referring to FIG. 1, in some embodiments, a substrate 100 having an overlay layer 102 thereon is provided. As shown in FIG. 1, in some embodiments, the overlay layer 102 is formed on the substrate 100 within the device region DR. It is understood that isolation structures 103 (seen in FIG. 8) may be included in the substrate 100 and the device region DR may be defined through the arrangement of the isolation structures. From FIG. 1 to FIG. 7, only a portion of the device region DR of the substrate 100 is shown for illustration purposes. Referring to FIG. 1, in some embodiments, the substrate 100 includes a semiconductor substrate. In one embodiment, the substrate 100 comprises a bulk semiconductor substrate such as a crystalline silicon substrate, or a doped semiconductor substrate (e.g., p-type or n-type semiconductor substrate). In one embodiment, the substrate 100 comprises a silicon-on-insulator substrate or a germanium-on-insulator substrate. In certain embodiments, the substrate 100 includes one or more doped regions or various types of doped regions, depending on design requirements. In some embodiments, the doped regions are doped with p-type and/or n-type dopants. For example, the p-type dopants are boron or BF2 and the n-type dopants are phosphorus or arsenic. In some embodiments, the substrate 100 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the substrate 100 includes a sapphire substrate. In some embodiments, the substrate 100 includes a glass substrate such as indium tin oxide (ITO) substrate.

Figure 8:
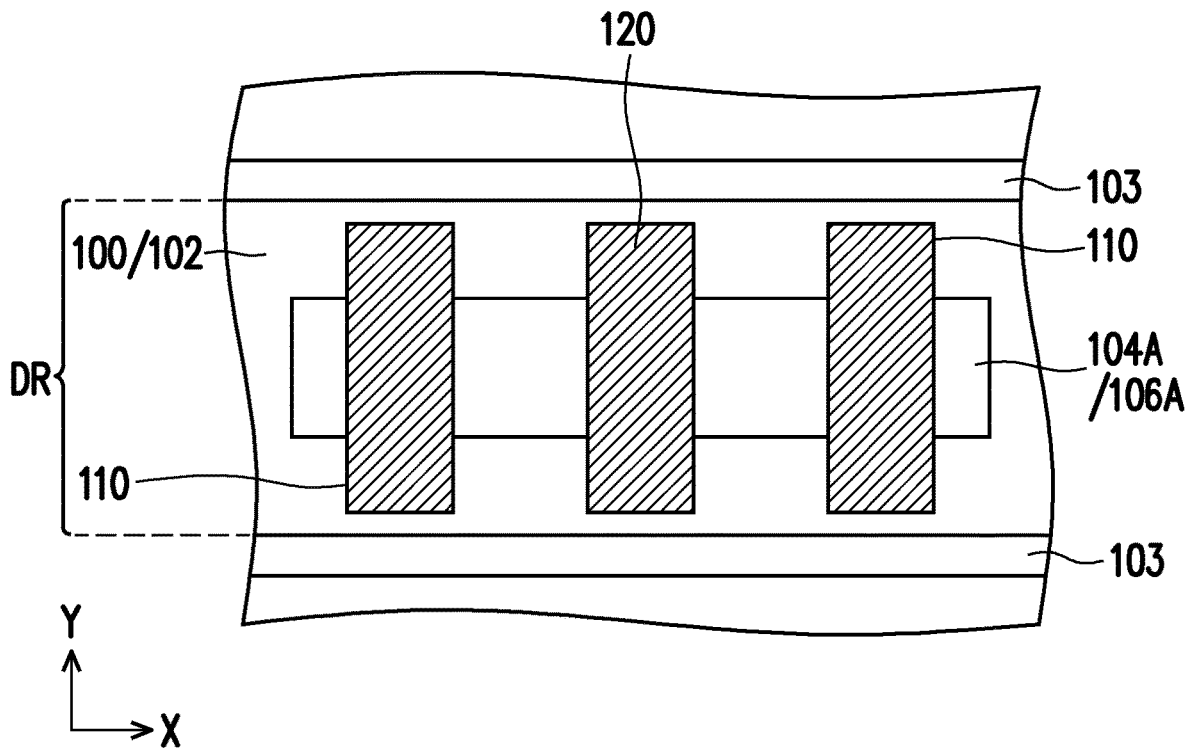

In some embodiments, the overlay layer 102 includes a silicon nitride layer. In some embodiments, the overlay layer 102 is optional and may be omitted. In some embodiments, the isolation structures 103 in FIG. 8 are trench isolation structures. In other embodiments, the isolation structures 103 includes local oxidation of silicon (LOCOS) structures. In some embodiments, the insulator material of the isolation structures 103 includes silicon oxide, silicon nitride, silicon oxynitride, a spin-on dielectric material, or a low-k dielectric material. In one embodiment, the insulator material may be formed by CVD such as high-density-plasma chemical vapor deposition (HDP-CVD) and sub-atmospheric CVD (SACVD) or formed by spin-on.

Low dimensional materials include nanoparticles, one-dimensional (1D) materials such as carbon nanotubes or nanowires and two-dimensional (2D) materials such as graphene, hexagonal boron nitride (h-BN), black phosphorus and transition metal dichalcogenides (TMDs). Among the 2D materials, different types of 2D materials may be classified based on their behaviors as semiconducting 2D materials (e.g. 2H TMDs), metallic 2D materials (e.g. 1T TMDs), and insulating 2D materials (e.g. h-BN). TMDs have the chemical formula $MX_2$, where M is a transition metal such as molybdenum (Mo) or tungsten (W) and X is a chalcogen such as sulfur (S), selenium (Se) or tellurium (Te). For TMDs having various crystal structures, the most common crystal structure is the 2H-phase with trigonal symmetry, which results in semiconducting characteristics (e.g. $MoS_2$, $WS_2$, $MoSe_2$ or $WSe_2$). Another possible crystal structure of TMDs is the 1T phase, which results in metallic characteristics (e.g. $WTe_2$).

TMD bulk crystals are formed of monolayers bound to each other by Van-der-Waals attraction. TMD monolayers have a direct band gap, and can be used in electronic devices such as TMD-based field-effect transistors (TMD-FETs).

Figure 2:
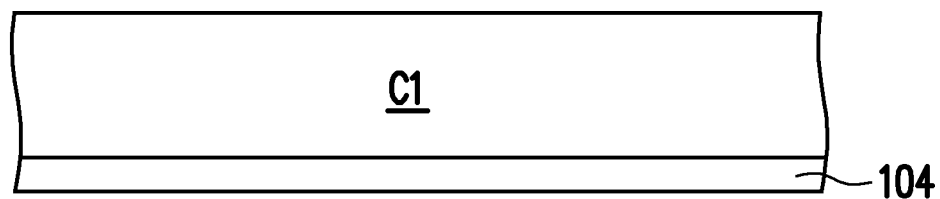
Figure 2:
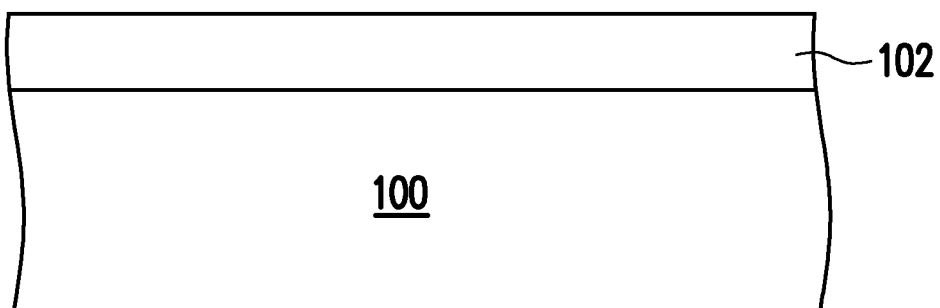

Referring to FIG. 2, a heat transfer layer 104 is provided. In some embodiments, the heat transfer layer 104 is carried by a carrier C1, and the carrier C1 and the heat transfer layer 104 are moved to the position above the substrate 100. In one embodiment, the heat transfer layer 104 is to be placed on a predetermined location within the device region DR. In some embodiments, the heat transfer layer 104 is disposed over the substrate 100 covering the whole device region DR of the substrate 100. In some embodiments, the heat transfer layer 104 is provided with a pattern and disposed over the substrate 100 covering a portion of the device region DR of the substrate 100. The formation of the heat transfer layer 104 involves the methods of chemical vapor deposition (CVD), solution based chemical synthesis and/or mechanical or liquid exfoliation. In some embodiments, the heat transfer layer 104 may be made of a material having a thermal conductivity of about 30 W/m/K or larger. In some embodiments, the heat transfer layer 104 may be made of a material having a thermal conductivity of about 200-400 W/m/K. In some embodiments, the material of the heat transfer layer 104 includes an insulating 2D material. In some embodiments, the material of the heat transfer layer 104 includes boron nitride. For example, boron nitride may be amorphous boron nitride, hexagonal boron nitride (h-BN) or cubic boron nitride (c-BN). For example, the formation of the heat transfer layer 104 involves CVD forming monolayers of h-BN on a metal or copper alloy foil and then transferred to the carrier. In some embodiments, the material of the heat transfer layer 104 includes aluminum nitride (AlN). In some embodiments, the material of the heat transfer layer 104 includes magnesium oxide (MgO) or silicon nitride.

Figure 3:
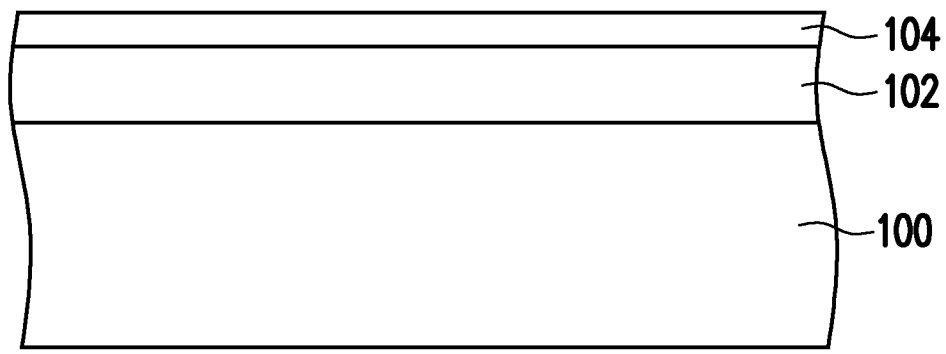

Referring to FIG. 3, the heat transfer layer 104 is transferred onto the substrate 100 and is disposed on the overlay layer 102. In some embodiments, the heat transfer layer 104 has a thickness of about 0.3 nm to about 10 nm. In one embodiment, the heat transfer layer 104 includes multilayers of h-BN. Later, a channel material layer 106 is provided and carried by a carrier C2. The carrier C2 and the channel material layer 106 are moved to the position above the substrate 100. In one embodiment, the channel material layer 106 is to be placed on the heat transfer layer 104 at a predetermined location within the device region DR. The formation of the channel material layer 106 involves the methods of pulse lase deposition (PLD), CVD, plasma-enhanced atomic layer deposition (PEALD), solution based chemical synthesis and/or mechanical or liquid exfoliation. In some embodiments, the material of the channel material layer 106 includes a semiconducting 2D material. In some embodiments, the material of the channel material layer 106 includes a transition metal dichalcogenide (TMD) having the chemical formula $MX_2$, where M is a molybdenum (Mo) or tungsten (W) and X is sulfur (S), selenium (Se) or tellurium (Te). In some embodiments, the material of the channel material layer 106 includes $MoS_2$, $WS_2$, or $WSe_2$. For example, the formation of the channel material layer 106 involves CVD selectively forming monolayer(s) of TMD such as 2H phase of $MoS_2$, $WS_2$, or $WSe_2$ and then transferred to the carrier. In some embodiments, the channel material layer 106 includes carbon nanotubes or nanoribbons.

Figure 4:
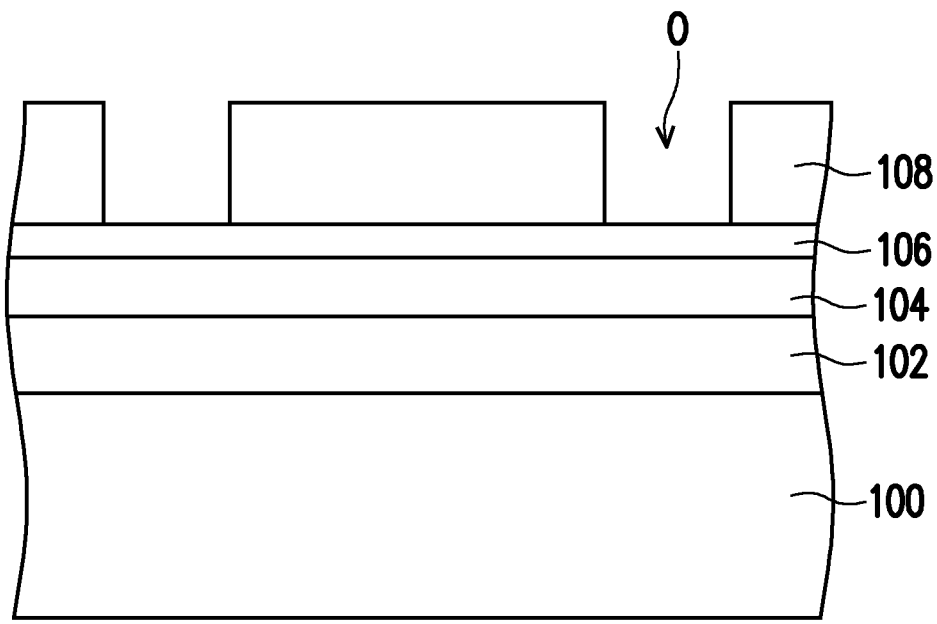

Referring to FIG. 4, in some embodiments, the channel material layer 106 is transferred onto the substrate 100 and is disposed on the heat transfer layer 104. In some embodiments, the channel material layer 106 has a thickness of about 0.3 nm to about 5 nm, or about 0.3 nm to about 1 nm. In one embodiment, the channel material layer 106 includes one or a few atomic layers of $MoS_2$. In some embodiments, the heat transfer layer 104 and the channel material layer 106 are placed sequentially onto the overlay layer 102 and the heat transfer layer 104 and the channel material layer 106 are individually transferred through different carriers C1 and C2. In some other embodiments, the heat transfer layer 104 and the channel material layer 106 are transferred and laminated as a stack on one carrier and then the stack is placed onto the overlay layer 102 on the substrate 100.

Alternatively, in some embodiments, either the heat transfer layer 104 or the channel material layer 106 or both may be formed through a growth process over the substrate 100. The growth process utilizing patterned nucleation seeds for forming TMDs is a well-controlled process and the formation may be performed on-site (at the same location). In some embodiments, the growth process includes a CVD process. The CVD process may include a process performed by, for example, electron cyclotron resonance CVD (ECR-CVD), microwave plasma CVD, plasma enhanced CVD (PECVD), low-pressure CVD (LPCVD), thermal CVD or hot filament CVD. In other embodiments, the growth process is a physical vapor deposition (PVD) process. Compared with the transferring formation method, the growth process is well applicable for high density or fine pitch integrated circuitry.

In some embodiments, the channel material layer 106 is disposed over the substrate 100 covering the whole device region DR of the substrate 100. In one embodiment, the heat transfer layer 104 and the channel material layer 106 are patterned through photolithographic and etching techniques to have substantially the same the pattern. In some embodiments, the channel material layer 106 is provided with a pattern and disposed over the substrate 100 covering a portion of the device region DR of the substrate 100. In one embodiment, the pattern of the heat transfer layer 104 is substantially the same as the pattern of the channel material layer 106. In one embodiment, the pattern of the heat transfer layer 104 is larger in span than that of the pattern of the channel material layer 106.

As described above, in some embodiments, the heat transfer layer 104 and the channel material layer 106 disposed directly on the heat transfer layer 104 form a stack film, and the underlying heat transfer layer 104 helps to enhance heat dissipation of the device. In some embodiments, because the channel material layer 106 may include a semiconducting 2D material and the heat transfer layer may include a 2D material of high thermal conductivity, the material compatibility makes the interface between the channel material layer 106 and the heat transfer layer 104 an atomic smooth interface without much surface scattering.

In some embodiments, the overlay layer 102 is skipped, and the heat transfer layer 104 is disposed directly on the surface of the substrate 100 with the channel material layer 106 stacked above the heat transfer layer 104 as seen in FIG. 8.

Referring to FIG. 4, after the channel material layer 106 is provided and disposed on the heat transfer layer 104, a photoresist pattern 108 having openings O is formed on the channel material layer 106 and over the substrate 100. The formation of the photoresist pattern 108 includes forming a photoresist layer (not shown) over the substrate 100 by CVD or coating and patterning the photoresist layer through exposure and development to form the photoresist pattern 108 with the openings O. For example, the openings O of the photoresist pattern are formed with the outlines or shapes defining the later-formed source and drain regions and formed at locations corresponding to the later-formed source and drain regions. In some embodiments, the photoresist pattern 108 covers the channel material layer 106 with the openings O exposing portions of the channel material layer 106.

Figure 5:
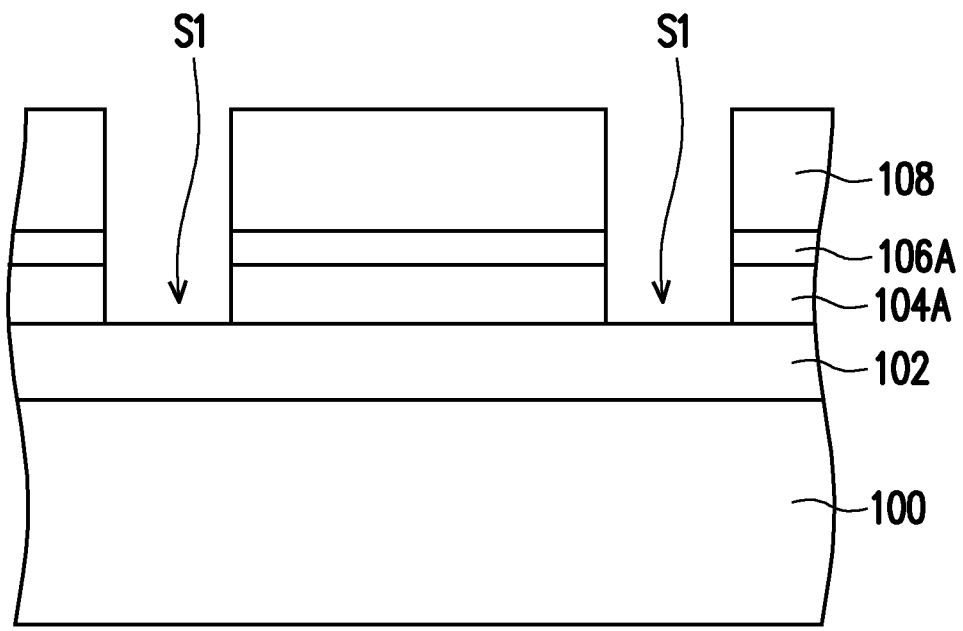

Referring to FIG. 5, using the photoresist pattern 108 as a mask, an etching process is performed to remove portions of the channel material layer 106 and the underlying heat transfer layer 104 to form the patterned channel material layer 106A and the patterned heat transfer layer 104A. In some embodiments, through the etching process, portions of the channel material layer 106 that are exposed by the openings O and the directly beneath heat transfer layer 104 are removed until the overlay layer 102 is exposed and trench openings S1 are formed in the patterned channel material layer 106A and the patterned heat transfer layer 104A exposing the overlay layer 102.

In some embodiments, the etching process includes performing one or more anisotropic etching process(es), isotropic etching process(es) or a combination thereof. In some embodiments, the etching process may include performing a reactive ion etching process or an atomic layer etching process. In some embodiments, the etching process may include performing a reactive gas-assisted etching process or a metal-assisted chemical etching process. In some embodiments, the etching process may include performing a laser etching process and/or a thermal annealing process.

In some embodiments, using the photoresist pattern 108 as a mask, the etching process is performed to remove portions of the channel material layer 106 that are exposed by the openings O without removing the underlying heat transfer layer 104.

Figure 6:
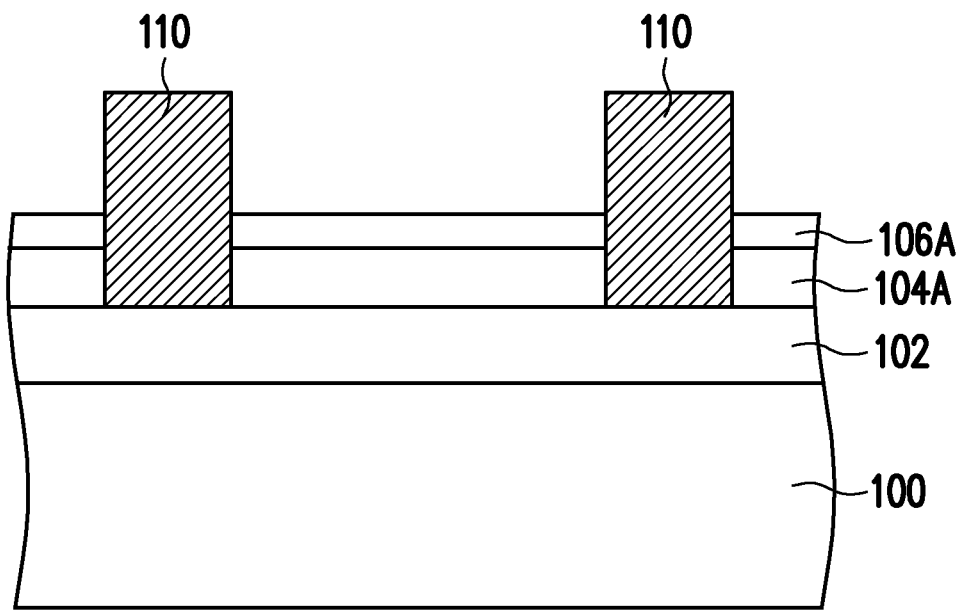

Referring to FIG. 6, source and drain terminals 110 are formed in the trench openings S1 and on the overlay layer 102. In some embodiments, after the trench openings S1 are formed with the photoresist pattern 108 remained on the patterned channel material layer 106A, the source and drain terminals 110 are formed inside the trench openings S1 and fill up the trench openings S1. After the source and drain terminals 110 are formed, the photoresist pattern 108 is removed. Through the formation of the source and drain terminals 110, the region of the patterned channel material layer 106A located between the source and drain terminals 110 may function as the channel region CR. On the other hand, the portions of the patterned channel material layer 106A located outside the source and drain terminals 110 are electrically floated and functionally futile.

The formation of the source and drain terminals 110 includes forming a metallic material (not shown) over the patterned channel material layer 106A and filling up the trench openings S1 to form the metallic source and drain terminals 110. For example, an optional seed/liner material layer (not shown) may be formed covering the sidewalls and the bottoms of the trench openings S1 before forming the metallic material. In some embodiments, the metallic material includes one or more materials selected from titanium (Ti), chromium (Cr), tungsten (W), scandium (Sc), niobium (Nb), nickel (Ni), palladium (Pd), platinum (Pt), silver (Ag), gold (Au), aluminum (Al), ruthenium (Ru), molybdenum (Mo), tantalum (Ta), alloys thereof, and nitrides thereof, for example. In some embodiments, the metallic material includes titanium (Ti), chromium (Cr), tungsten (W), scandium (Sc), niobium (Nb), nickel (Ni), palladium (Pd), platinum (Pt), silver (Ag), gold (Au), aluminum (Al) or combinations thereof. In some embodiments, the metallic material is formed by CVD (such as metal organic CVD) or PVD (such as thermal evaporation). In some embodiments, the formation of the metallic material may include performing a plating process (such as electrochemical plating (ECP)). In some embodiments, the metallic material includes palladium, titanium or gold formed by a metal organic CVD process.

In some embodiments, the extra seed/liner material and the extra metallic material may be removed by performing a planarization process, an etching process, or other suitable processes. In some embodiments, the planarization process may include performing a chemical mechanical polishing (CMP) process.

As described above, in some embodiments, a heat transfer layer is included in the structure and the heat transfer layer includes 2D material(s) of high thermal conductivity. The heat transfer layer (or heat dissipating material) located between the substrate and the channel layer and having high thermal conductivity enhances heat dissipating ability of the device and improves the device performance. In addition, better heat dissipation can be achieved when the source and drain terminals 110 penetrating through the channel layer are landed directly on the heat transfer layer, and the heat generated during operation may be dissipated through the heat transfer layer located underneath the source and drain terminals.

Figure 7:
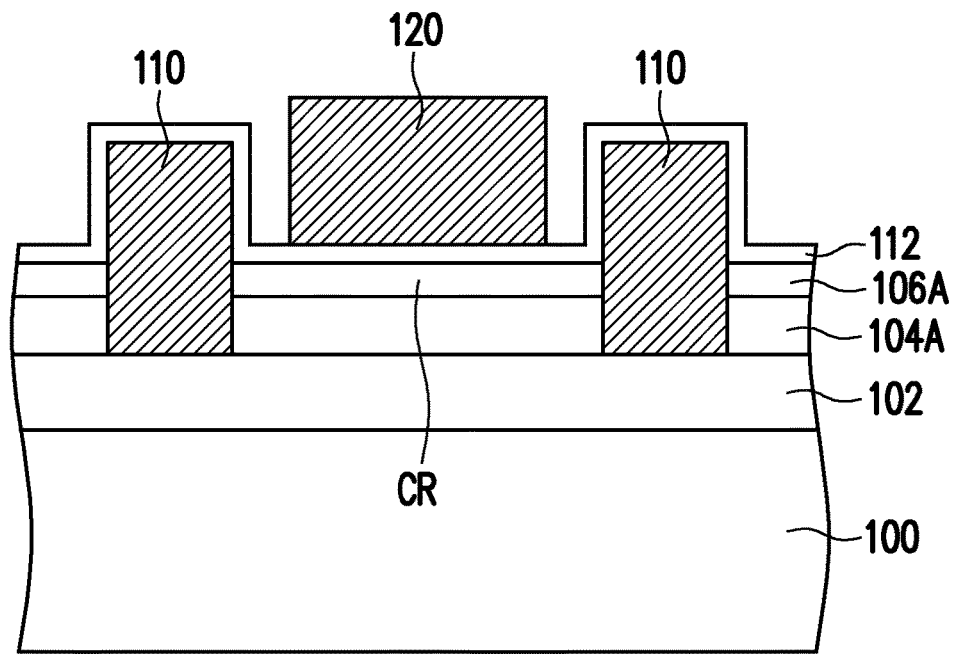

Referring to FIG. 7, a dielectric layer 112 is formed over the patterned channel material layer 106A and the source and drain terminals 110. In some embodiments, the dielectric layer 112 conformally covers the patterned channel material layer 106A and the source and drain terminals 110 within the device region DR. In some embodiments, the material of the dielectric layer 112 includes an oxide material such as hafnium oxide (e.g. $HfO_2$), aluminum oxide (e.g. $Al_2O_3$), or zirconium oxide (e.g. $ZrO_2$), or other suitable high-k dielectric material(s). It should be noted that the high-k dielectric materials are generally dielectric materials having a dielectric constant larger than 3.9, or greater than about 10, or greater than about 12, or even greater than about 16. For example, the high-k materials may include metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof. In some embodiments, the material of the dielectric layer 112 includes hexagonal boron nitride (h-BN). For example, the dielectric layer 112 may be formed by CVD such as high-density-plasma chemical vapor deposition (HDP-CVD), sub-atmospheric CVD (SACVD), or atomic layer deposition (ALD). In some embodiments, the dielectric layer 112 has a thickness ranging from about 0.5 nm to about 15 nm.

Referring to FIG. 7 and FIG. 8, after the dielectric layer 112 is formed, a gate structure 120 is formed on the dielectric layer 112 and between the source and drain terminals 110. In some embodiments, the gate structure 120 is formed over the active channel region CR of the patterned channel material layer 106A. In some embodiments, after the gate structure 120 is formed, the extra dielectric layer 112 located outside the gate structure 120 is removed. The remained dielectric layer 112A underlying the gate structure 120 functions as the gate dielectric layer. In some embodiments, as seen in FIG. 8, within the device region defined by the isolation structures 103, the patterned heat transfer layer 104A and the patterned channel material layer 106A are each shaped as a strip extending in the X-direction, while the source and drain terminals 110 and the gate structure 120 are shaped as parallel strips extending along the Y-direction that is substantially perpendicular to the X-direction. From the top view of FIG. 8, the source and drain terminals 110 and the gate structure 120 individually intersect with and cover the strip shaped patterns of the patterned heat transfer layer 104A and the patterned channel material layer 106A. It is understood that the gate structure may be separated/cut into different sections based on the design requirement of the device. In some embodiments, the gate structure 120 may be formed by blanketly forming a gate electrode material layer (not shown) and then patterning the gate electrode material layer into the strip shaped gate structure. In some embodiments, the gate structure 120 has a thickness ranging from about 1 nm to about 30 nm.

In some embodiments, the material of the gate structure 120 includes a metal or a metal alloy, or metal nitride. For example, in some embodiments, the material of the gate structure 120 includes Ti. Pt, Pd, Au, W, Ag, Ni, Al, TiN, tantalum nitride (TaN), tungsten nitride (WN), or combinations thereof. Moreover, the gate structure may further include a liner layer, an interfacial layer, a work function layer, or a combination thereof. In some alternative embodiments, a seed layer, a barrier layer, an adhesion layer, or a combination thereof may also be included between the gate structure 120 and the channel material layer 106A. In some embodiments, the gate structure 120 is formed by CVD (such as MOCVD) or PVD (such as thermal evaporation). In some embodiments, the formation of the gate structure 120 may include performing a plating process (such as ECP).

Figure 9:
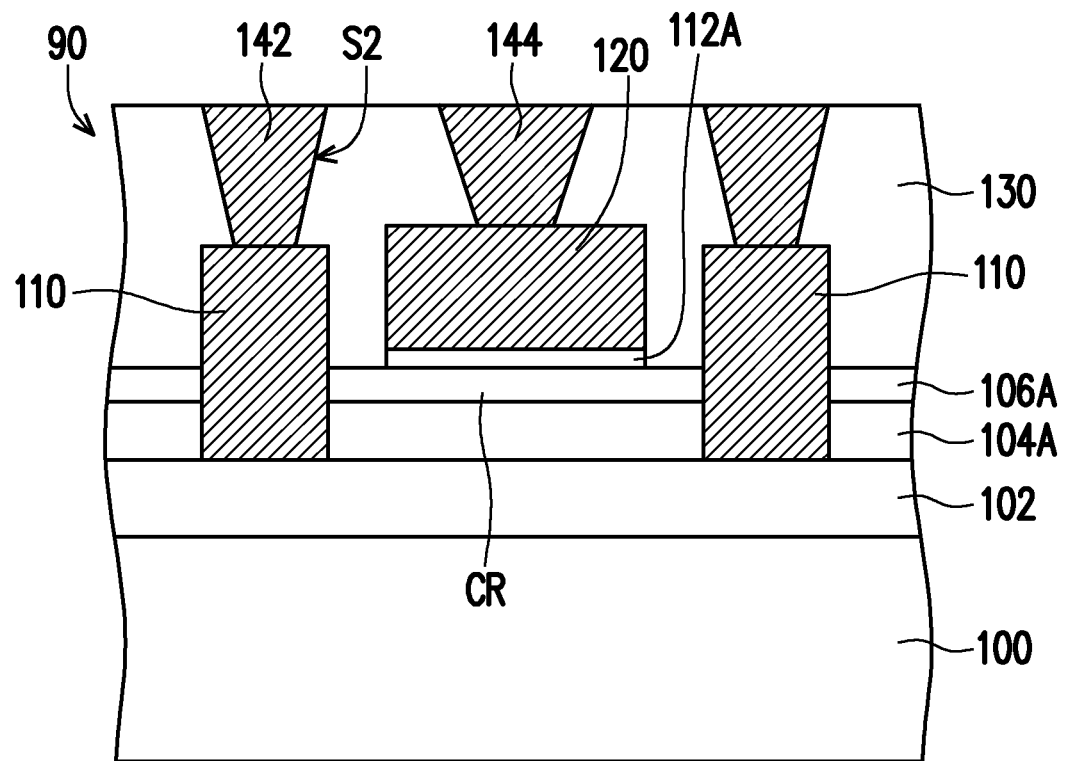

Referring to FIG. 9, an interlayer dielectric (ILD) layer 130 is formed blanketly over the substrate 100, covering the patterned channel material layer 106A and the dielectric layer 112A. In some embodiments, the ILD layer 130 covers the gate structure 120 and the source and drain terminals 110. In some embodiments, the material of the ILD layer 130 includes silicon oxide, silicon nitride, or one or more low-k dielectric materials. Examples of low-k dielectric materials include silicate glass such as phospho-silicate-glass (PSG) and boro-phospho-silicate-glass (BPSG), BLACK DIAMOND®, SILK®, hydrogen silsesquioxane (HSQ), fluorinated silicon oxide (SiOF), amorphous fluorinated carbon, parylene, BCB (bis-benzocyclobutene), flare, or a combination thereof. It is understood that the ILD layer 130 may include one or more dielectric materials or one or more dielectric layers. In some embodiments, the ILD layer 130 is formed to a suitable thickness by flowable CVD (FCVD), PECVD, HDPCVD, SACVD, spin-on coating, or other suitable methods. For example, an interlayer dielectric material layer (not shown) may be formed by PECVD and an etching or polishing process may be performed to reduce the thickness of the interlayer dielectric material layer until a desirable thickness to form the ILD layer 130.

Referring to FIG. 9, after forming the ILD layer 130, contacts 142 and 144 are formed and a transistor device 90 (e.g. FET device) is formed. In some embodiments, the contacts 142 are formed in the ILD layer 130 at locations right above the source and drain terminals 110, and the contact 144 (only one is shown) is formed in the ILD layer 130 at the location right above the gate structure 120. In some embodiments, the contacts 142 and 144 directly contact and are connected to the source and drain terminals 110 and the gate structure 120 respectively.

In some embodiments, the formation of the contacts 142 and 144 includes forming a patterned mask layer (not shown) over the ILD layer 130, dry etching the ILD layer using the patterned mask layer as a mask to form contact openings S2 exposing the source and drain terminals 110 and the gate structure 120. As seen in FIG. 9, the contact openings S2 are shown with slant sidewalls. It is understood that the contact openings may be formed with substantially vertical sidewalls if feasible, and the number of the contact openings S2 is merely exemplary but not intended for limiting the scope of this disclosure. In some embodiments, the ILD layer 130 may further include an etch stop layer (not shown) therein for assisting the formation of the contact openings. Thereafter, a metallic material is deposited and filled into the contact openings to form the contacts 142 and 144. The metallic material includes Al, copper (Cu), W, cobalt (Co), alloys thereof or nitrides thereof, for example. In one embodiment, the metallic material is formed by performing a CVD process or a PVD process. Optionally, the extra metallic material may be removed by performing a planarization process, an etching process, or other suitable processes. In some embodiments, the planarization process may include performing a CMP process. As seen in FIG. 9, the top surface of the ILD layer 130 is substantially flush with and levelled with the top surfaces of the contacts 142 and 144.

Referring to FIG. 9, the structure of the transistor device 90 includes the overlayer 102 disposed on the substrate 100, the patterned heat transfer layer 104A and the patterned channel material layer 106A disposed on the overlay layer 102. In some embodiments, the structure of the transistor device 90 includes the gate structure 120 and the gate dielectric layer 112A disposed on the patterned channel material layer 106A and source and drain terminals 110 disposed on the overlay layer 102. In some embodiments, the channel material layer 106A located between the source and drain terminals 110 functions as the channel region CR (channel layer) of the transistor, and the source and drain terminals 110 are electrically connected (e.g. edge-contacted) with the channel region CR (channel layer) of the transistor. In some embodiments, in the transistor device 90, the gate dielectric layer 112A sandwiched between the gate structure 120 and the channel material layer 106A is in contact with the channel region CR but is spaced apart from the source and drain terminals 110. In some embodiments, the transistor structure 90 includes contacts 142 and 144 respectively in contact with the source and drain terminals 110 and the gate structure 120. In some embodiments, the transistor structure 90 is a top-gated transistor structure.

In the illustrated embodiments, the described methods and structures may be formed compatible with the current semiconductor manufacturing processes. In exemplary embodiments, the described methods and structures are formed during front-end-of-line (FEOL) processes. In one embodiment, the transistor device 90 is a logic device. In some embodiments, the material of the channel material layer 106 includes TMD and the transistor device 90 is a TMD-based field-effect transistor (TMD-FET).

The illustrated structure of transistor device 90 may be a portion of integrated circuits. In some embodiments, the illustrated structure may include active devices such as thin film transistors, high voltage transistors, passive components, such as resistors, capacitors, inductors, fuses, and/or other suitable components. In some embodiments, additional steps may be provided before, during, and after the process steps depicted from FIG. 1 to FIG. 9, and some of the steps described above may be replaced or eliminated, for additional embodiments of the method.

Figure 10:
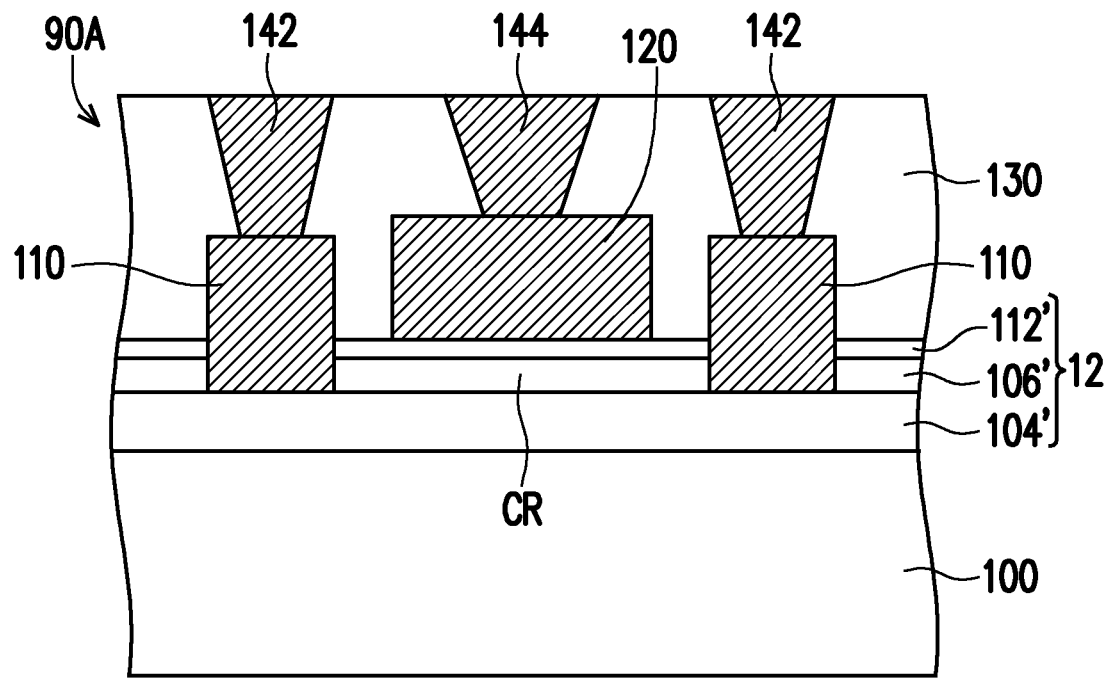
FIG. 10 and FIG. 11 are schematic cross-sectional views showing a semiconductor device in accordance with some embodiments of the disclosure.
Figure 11:
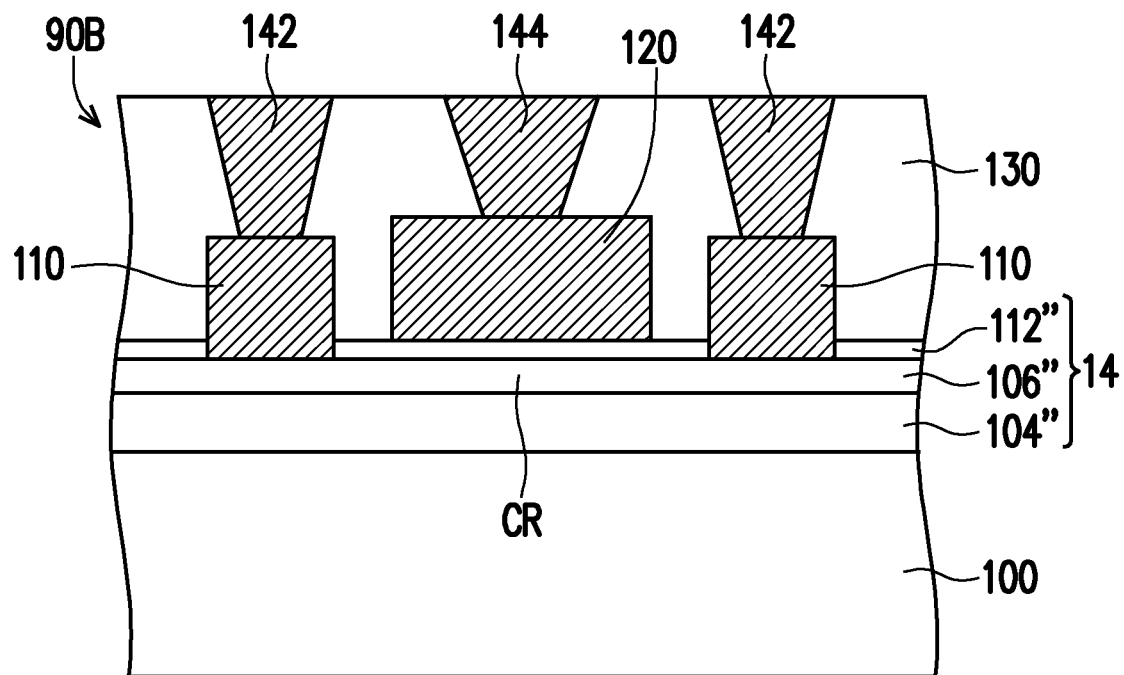

FIG. 10 and FIG. 11 are schematic cross-sectional views showing a semiconductor device in accordance with some embodiments of the disclosure. The exemplary structures shown in FIG. 10 and FIG. 11 may be fabricated following the process steps as described in the previous embodiments as shown from FIG. 1 to FIG. 9, and similar materials may be used as described in the previous embodiments may be used. However, it is understood that any other compatible process steps or methods or any other suitable materials may be utilized and comprehensible modifications or adjustments may be made for forming the exemplary structure of this disclosure.

Referring to FIG. 10, a transistor structure 90A includes a stack structure 12 disposed directly on the substrate 100, and the stack structure 12 incudes the heat transfer layer 104', the channel material layer 106' and the gate dielectric layer 112' sequentially stacked from the bottom to the top. In some embodiments, the transistor structure 90A includes source and drain terminals 110 disposed on the heat transfer layer 104' and penetrating through the channel material layer 106' and the gate dielectric layer 112'. In some embodiments, the channel material layer 106' located between the source and drain terminals 110 functions as the channel region CR (channel layer) of the transistor, and the source and drain terminals 110 are electrically connected with the channel region. In other words, the source and drain terminals 110 are edge-contacted with the channel region CR (channel layer) of the transistor. In some embodiments, the transistor structure 90A includes a gate structure 120 located on top of the stack structure 12 and in contact with the gate dielectric layer 112'. In some embodiments, the transistor structure 90A includes contacts 142 and 144 respectively in contact with the source and drain terminals 110 and the gate structure 120. In some embodiments, the transistor structure 90A is a top-gated transistor structure.

Referring to FIG. 11, a transistor structure 90B similar to the transistor structure 90A is illustrated. The transistor structure 90B includes a stack structure 14 disposed directly on the substrate 100, and the stack structure 14 incudes the heat transfer layer 104", the channel material layer 106" and the gate dielectric layer 112" sequentially stacked from the bottom to the top. In some embodiments, the transistor structure 90B includes source and drain terminals 110 disposed directly on the channel material layer 106" and penetrating through the gate dielectric layer 112". In some embodiments, the channel material layer 106" located between the source and drain terminals 110 functions as the channel region CR (channel layer) of the transistor, and the source and drain terminals 110 are electrically connected (e.g. top-contacted) with the channel region CR. In some embodiments, the transistor structure 90B includes a gate structure 120 located on top of the stack structure 14 and in contact with the gate dielectric layer 112". In some embodiments, the transistor structure 90B includes contacts 142 and 144 respectively in contact with the source and drain terminals 110 and the gate structure 120.

As described above, through the heat transfer layer having high thermal conductivity, the arrangement of the heat transfer layer 104' or 104" directly on the substrate 100 and between the substrate 100 and the channel layer CR further enhances the heat dissipating ability of the device and improves the device performance. In addition, better heat dissipation can be achieved when the source and drain terminals 110 are edge-contacted with the channel layer CR and are landed directly on the heat transfer layer 104', and the heat generated during operation may be dissipated through the heat transfer layer located underneath the source and drain terminals. Also, since the source and drain terminals 110 are edge-contacted with the channel layer CR, clear Fermi level de-pinning effect is achieved and the current injection efficiency of the device is improved.

FIG. 12 to FIG. 18 are schematic top views and sectional views showing various stages in a method of fabricating a transistor device in accordance with some embodiments of the present disclosure. The process of fabricating the FET device according to some embodiments will be described in detail below.

Figure 12:
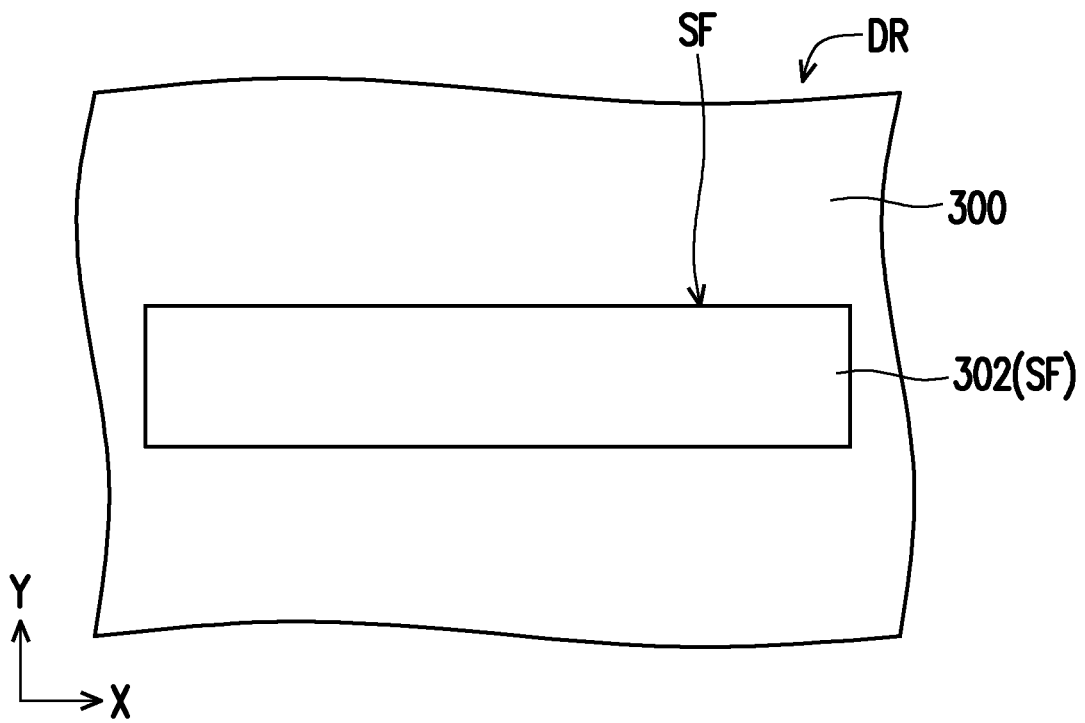
FIG. 12 to FIG. 18 are schematic top views and sectional views showing various stages in a method of fabricating a transistor device in accordance with some embodiments of the present disclosure.

FIG. 12 shows the schematic top view of one stage in a method of fabricating a FET device in accordance with some embodiments of the present disclosure. Referring to FIG. 12, a substrate 300 is provided and a material layer 302 is formed on the substrate 300. In some embodiments, the substrate 300 is similar to the substrate 100 described in the previous embodiments, and only a portion of the device region DR of the substrate 300 is shown for illustration purposes. In some embodiments, the formation of the material layer 302 includes forming an insulating material (not shown) by CVD over the substrate 300 and patterning the insulating material into the material layer 302 through one or more etching process and partially exposing the underlying substrate 300. In some embodiments, the material layer 302 includes an insulating material such as silicon oxide, silicon oxynitride or silicon nitride. In some embodiments, the material layer 302 is formed by chemical vapor deposition (CVD), such as plasma enhanced CVD (PECVD) or low-pressure CVD (LPCVD) or atomic layer deposition (ALD). In some embodiments, the material layer 302 includes a strip fin pattern SF extending in X-direction, and the fin pattern protrudes upright from the surface of the substrate 300 (in the thickness direction). As shown in FIG. 12, the strip fin pattern SF has one strip fin, but two or more strip fins are possible, and the number, the geometric shape and the arrangement of the patterns are not limited to the embodiments of the present disclosure.

Figure 13:
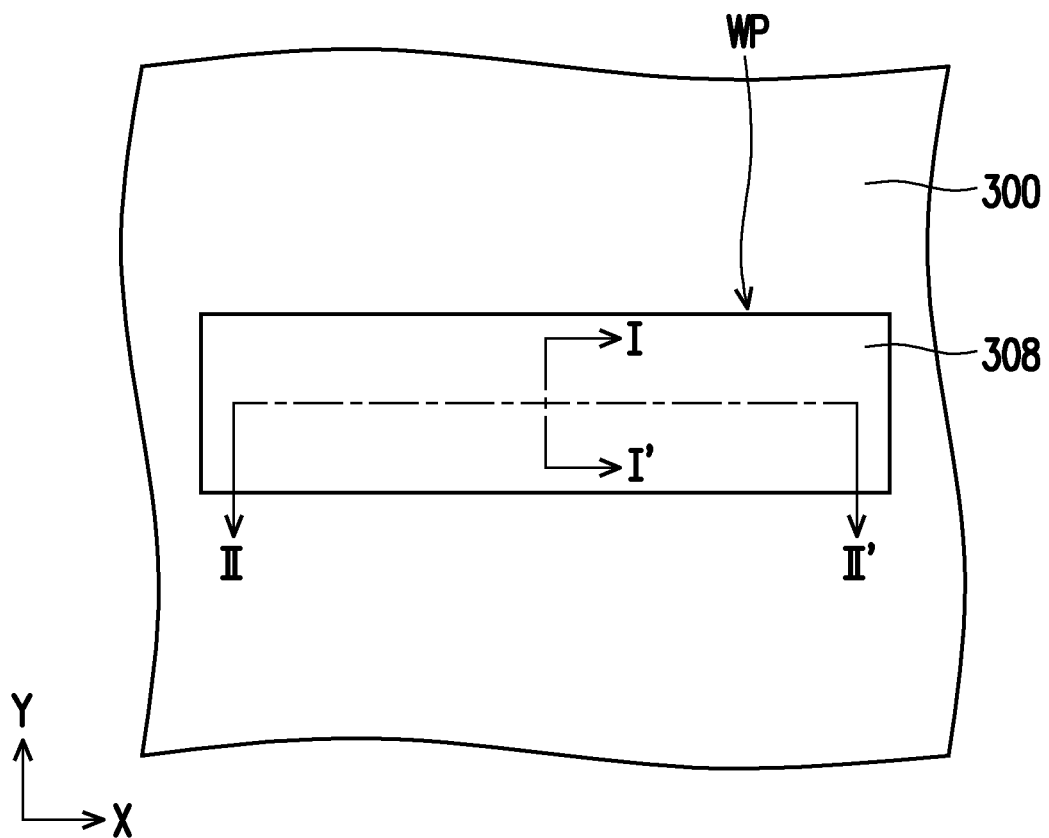
Figure 14:
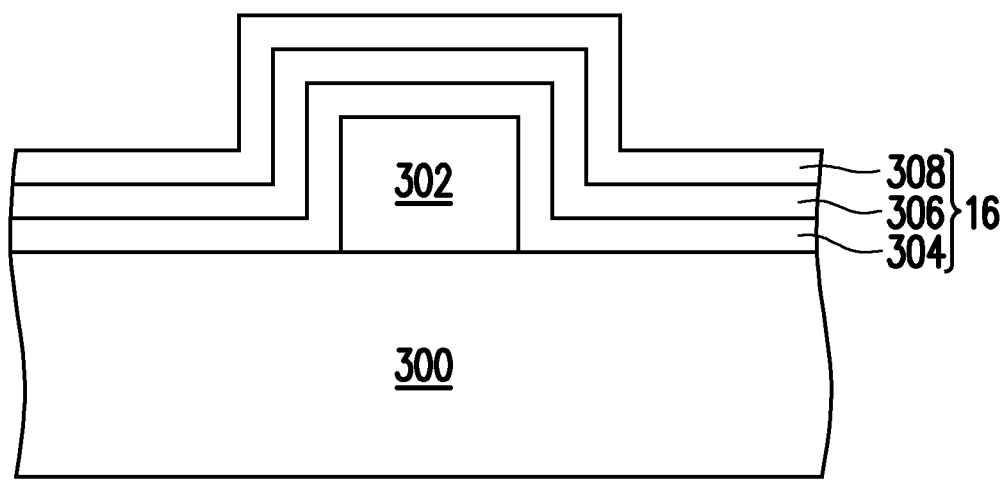
Figure 15:
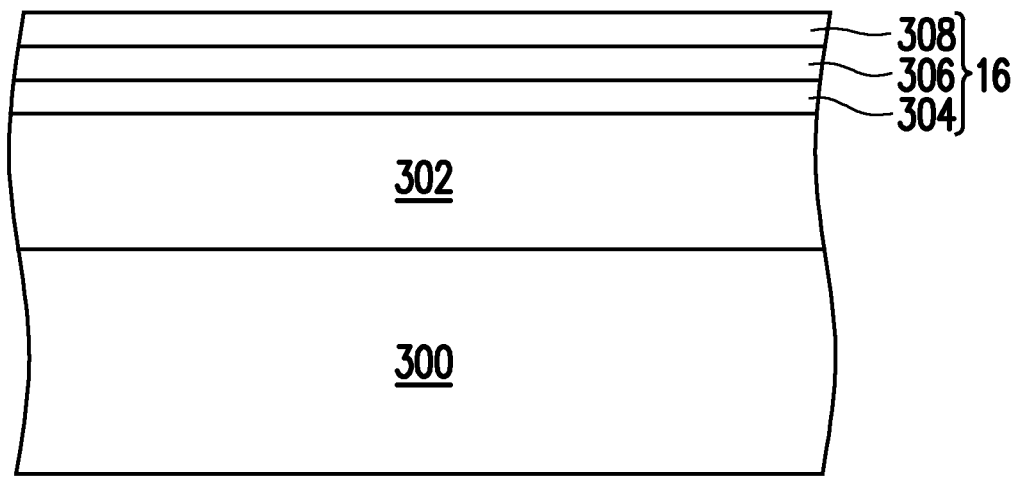

FIG. 13 shows the schematic top view of one stage in a method of fabricating a FET device in accordance with some embodiments of the present disclosure. FIG. 14 and FIG. 15 show schematic cross-sectional views of the structure shown in FIG. 13 along cross-section lines I-I' and II-IF respectively. Referring to FIG. 13, FIG. 14 and FIG. 15, a first heat transfer layer 304, a channel material layer 306 and a second heat transfer layer 308 are sequentially formed over the substrate 300 and the material layer 302. In some embodiments, as seen in FIG. 15, the first heat transfer layer 304, the channel material layer 306 and the second heat transfer layer 308 are stacked in sequence as a stack 16. From the top view of FIG. 13, the stack 16 is formed with a wide strip pattern WP extending in X-direction fully covering the underlying strip fin pattern SF, and the wide strip pattern WP has a width (in the Y-direction) wider than that of the strip fin pattern SF. As seen in FIG. 14, the channel material layer 306 is formed along the profile of the strip fin pattern SF of the material layer 302, and the existence of the three-dimensional structure (strip fin patterns SF) can increase the effective channel width, which is beneficial for the device performance and saves the active area for higher device density.

In some embodiments, either the first heat transfer layer 304 or the second heat transfer layer 308 is made of a material having a thermal conductivity of about 30 W/m/K or larger. In some embodiments, the first heat transfer layer 304 or the second heat transfer layer 308 is made of a material having a thermal conductivity of about 200-400 W/m/K. In some embodiments, the material of the first heat transfer layer 304 includes an insulating 2D material. In some embodiments, the material of the first heat transfer layer 304 includes boron nitride. For example, boron nitride may be amorphous boron nitride, hexagonal boron nitride (h-BN) or cubic boron nitride (c-BN). In some embodiments, the material of the second heat transfer layer 308 includes an insulating 2D material. In some embodiments, the material of the second heat transfer layer 308 includes boron nitride such as hexagonal boron nitride (h-BN) or cubic boron nitride (c-BN). In some embodiments, the material of the second heat transfer layer 308 is substantially the same as the material of the first heat transfer layer 304. In some embodiments, the material of the second heat transfer layer 308 is different from the material of the first heat transfer layer 304. In some embodiments, the material of the second heat transfer layer 308 has a thermal conductivity lower than that of the material of the first heat transfer layer 304. In some embodiments, the material of the second heat transfer layer 308 includes aluminum nitride (AlN). In some embodiments, the material of the second heat transfer layer 308 includes magnesium oxide (MgO) or silicon nitride.

In some embodiments, the material of the channel material layer 306 includes a semiconducting 2D material. In some embodiments, the material of the channel material layer 306 includes a transition metal dichalcogenide (TMD) having the chemical formula $MX_2$, where M is a molybdenum (Mo) or tungsten (W) and X is sulfur (S), selenium (Se) or tellurium (Te). In some embodiments, the material of the channel material layer 306 includes $MoS_2$, $WS_2$, or $WSe_2$. In some embodiments, the channel material layer 306 includes carbon nanotubes or nanoribbons.

For example, the formation of the stack 16 involves individually CVD forming the first heat transfer layer 304, the channel material layer 306 and the second heat transfer layer 308 and transferring the first heat transfer layer 304, the channel material layer 306 and the second heat transfer layer 308 onto the substrate 300 and covering the strip fin pattern SF of the material layer 302. In some embodiments, through different growth processes, the first heat transfer layer 304, the channel material layer 306 and the second heat transfer layer 308 may be epitaxially grown locally and directly on the substrate and over the strip fin pattern SF of the material layer 302. In some embodiments, as seen in FIG. 14, the stack 16 of the first heat transfer layer 304, the channel material layer 306 and the second heat transfer layer 308 cover the sidewalls and the top surface of the strip fin pattern SF and cover a portion of the substrate 300.

In some embodiments, when the first heat transfer layer 304 and the second heat transfer layer 308 include insulating 2D materials and the channel material layer 306 includes a semiconducting 2D material, due to the material compatibility, the interfaces between the channel material layer 306 and the first heat transfer layer 304 and between the channel material layer 306 and the second heat transfer layer 308 are atomic smooth interfaces without much surface scattering. In some embodiments, when the first heat transfer layer 304 includes an insulating 2D material and the channel material layer 306 includes a semiconducting 2D material, the smooth interface between the channel material layer 306 and the first heat transfer layer 304 helps to minimize surface scattering.

Figure 16:
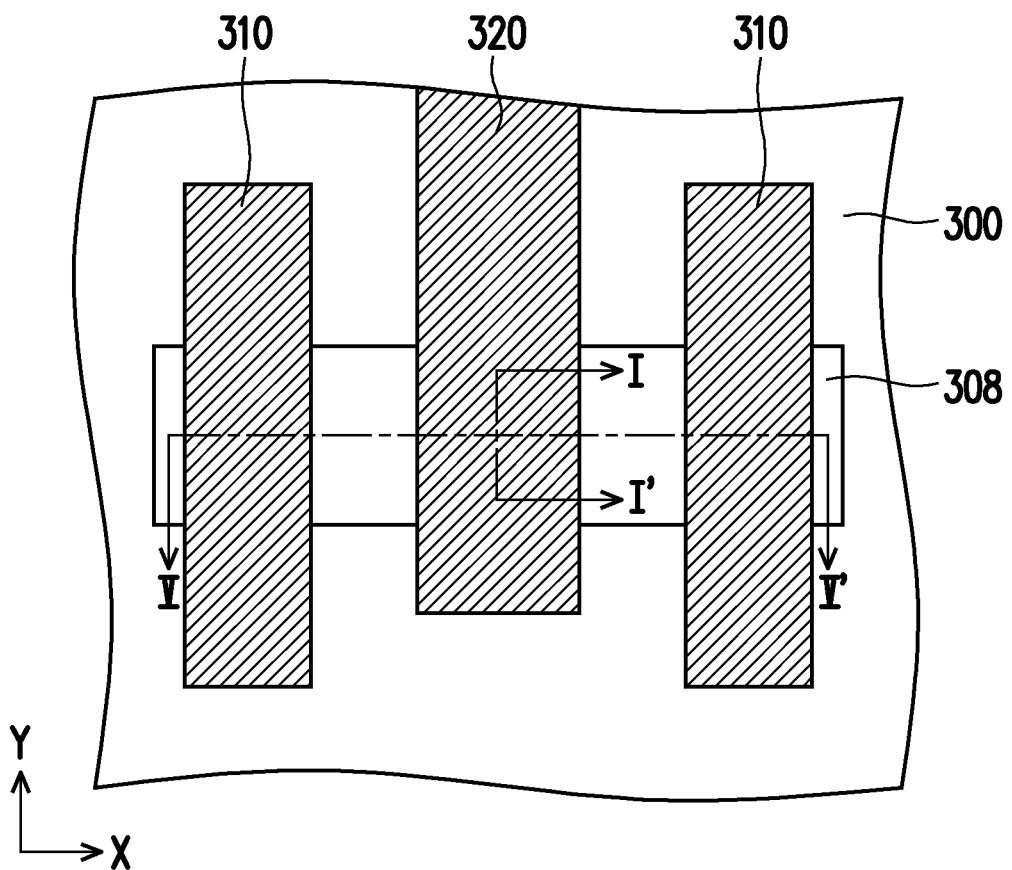
Figure 17:
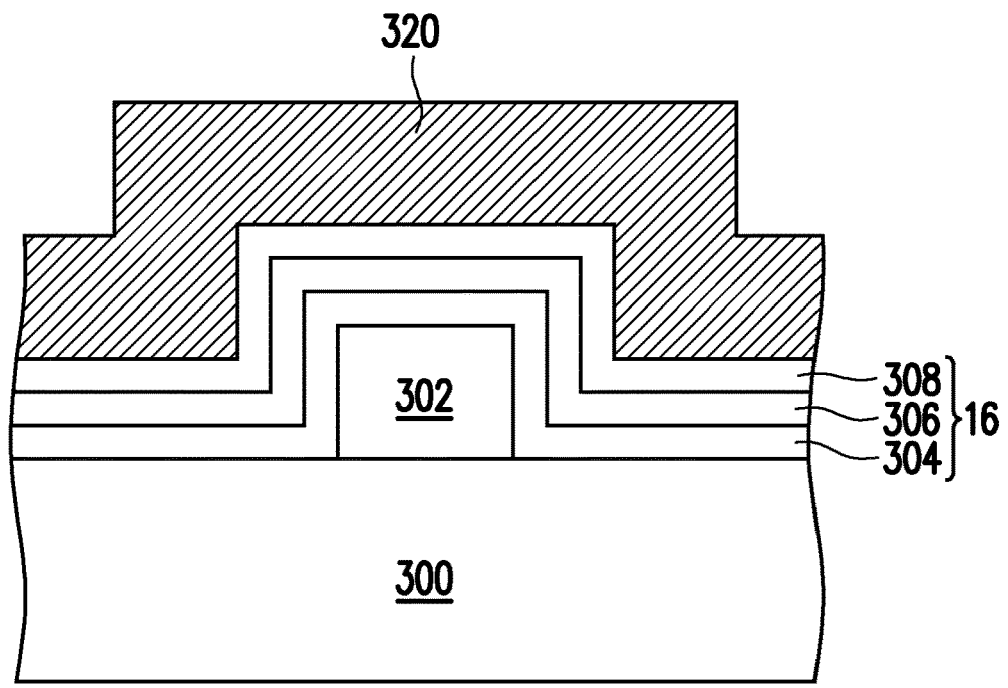
Figure 18:
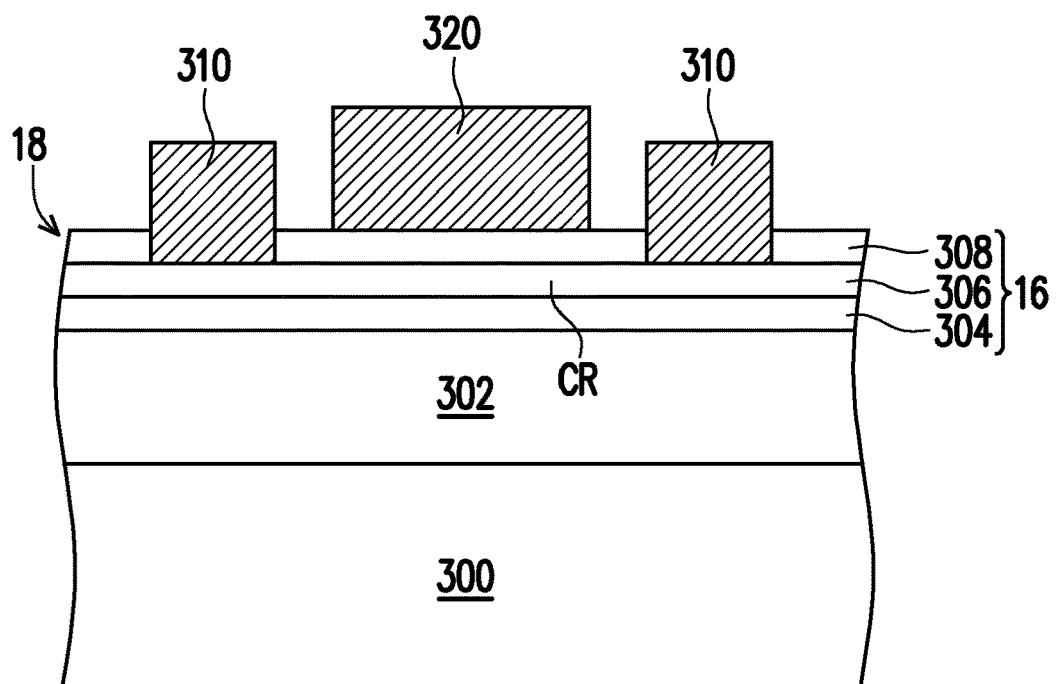

FIG. 16 shows the schematic top view of one stage in a method of fabricating a FET device in accordance with some embodiments of the present disclosure. FIG. 17 and FIG. 18 show schematic cross-sectional views of the structure shown in FIG. 16 along cross-section lines I-I' and II-IF respectively. Referring to FIG. 16, FIG. 17 and FIG. 18, source and drain terminals 310 are formed on the channel material layer 306 penetrating through the second heat transfer layer 308. From the top view of FIG. 16, the source and drain terminals 310 are formed as parallel strip patterns extending in Y-direction and intersecting with the stack 16 and arranged near two ends of the wide strip pattern WP of the stack 16. Later, a gate structure 320 is formed on the second heat transfer layer 308 and between the source and drain terminals 310. In one embodiment, the second heat transfer layer 308 may function as the gate dielectric layer. From the top view of FIG. 16, the gate structure 320 is formed as a strip pattern extending in Y-direction and intersecting with the stack 16 and arranged between the source and drain terminals 310 and spaced apart from the source and drain terminals 310. The formation methods and materials for forming the source and drain terminals and the gate structure may be similar to those described in the previous embodiments, and the details will not be repeated herein again.

Referring to FIG. 18, after forming the gate structure 320, one or more ILD layers and contacts are formed over the structure including a transistor device 18. It is understood that similar elements, materials and formation methods as de scribed in previous embodiments are applicable for the structure 18. The illustrated structure of transistor device 18 may be a portion of integrated circuits. In some embodiments, the illustrated structure may include active devices such as thin film transistors, high voltage transistors, passive components, such as resistors, capacitors, inductors, fuses, and/or other suitable components. In some embodiments, additional steps may be provided before, during, and after the process steps depicted from FIG. 12 to FIG. 18, and some of the steps described above may be replaced or eliminated, for additional embodiments of the method.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 19:
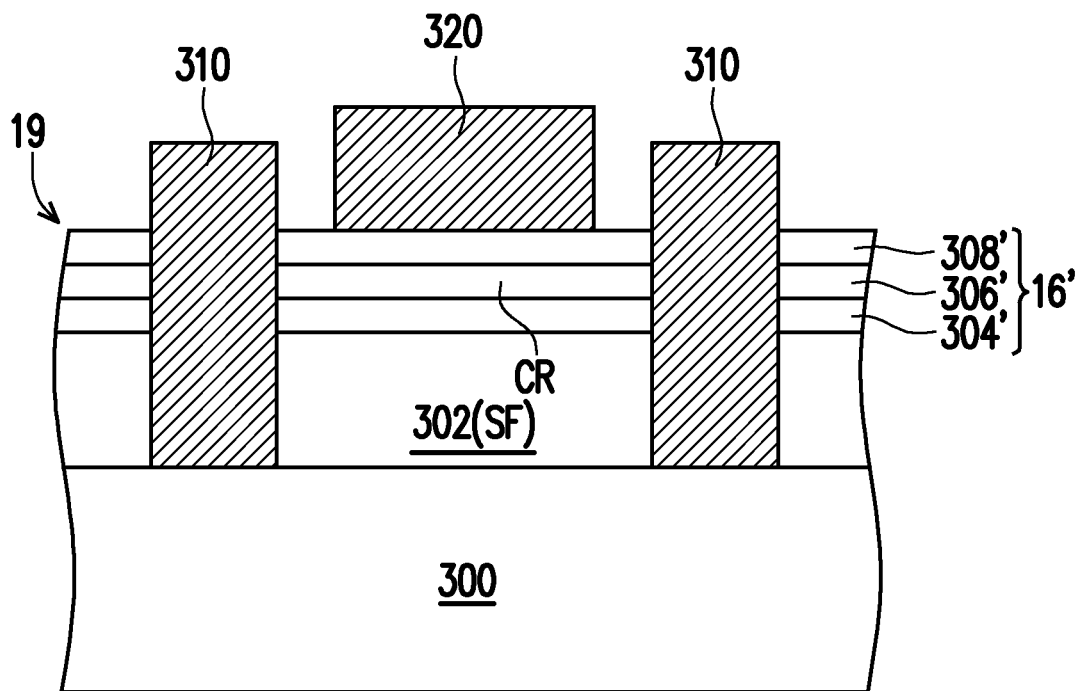
FIG. 19 and FIG. 20 are schematic cross-sectional views showing a semiconductor device in accordance with some embodiments of the disclosure.
Figure 20:
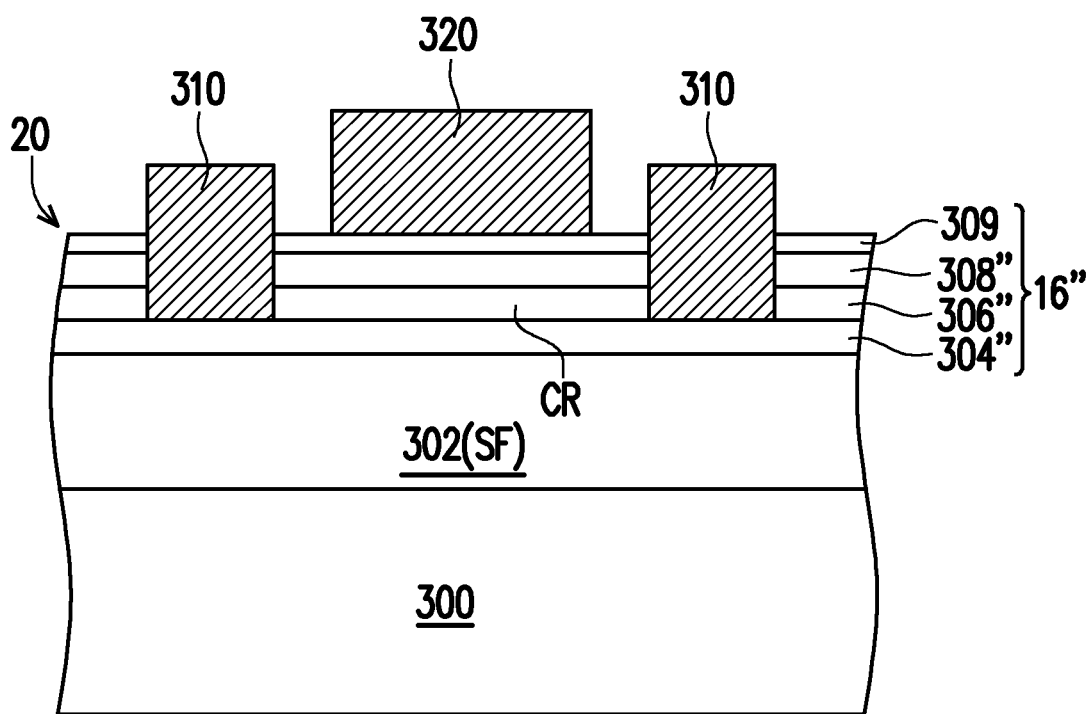

FIG. 19 and FIG. 20 are schematic cross-sectional views showing a semiconductor device in accordance with some embodiments of the disclosure. The exemplary structures shown in FIG. 19 and FIG. 20 may be fabricated following the process steps as described in the previous embodiments as shown from FIG. 1 to FIG. 9 or from FIG. 12 to FIG. 18, and similar materials may be used as described in the previous embodiments may be used. However, it is understood that any other compatible process steps or methods or any other suitable materials may be utilized and comprehensible modifications or adjustments may be made for forming the exemplary structure of this disclosure.

Referring to FIG. 19, a transistor structure 19 includes the material layer 302 disposed directly on the substrate 300 and a stack structure 16' disposed on and over the strip fin pattern SF of the material layer 302. In some embodiments, the stack structure 16' includes a first heat transfer layer 304', the channel material layer 306' and the second heat transfer layer 308' sequentially stacked from the bottom to the top. In some embodiments, the transistor structure 19 includes source and drain terminals 310 disposed on the substrate 300 penetrating thorough the second heat transfer layer 308', the channel material layer 306' and the first heat transfer layer 304'. In some embodiments, the channel material layer 306' located between the source and drain terminals 310 functions as the channel region CR (channel layer) of the transistor, and the source and drain terminals 310 are electrically connected with the channel region. In other words, the source and drain terminals 310 are edge-contacted with the channel region CR (channel layer) of the transistor. In some embodiments, the transistor structure 19 includes a gate structure 320 located on top of the stack structure 16' and in contact with the second heat transfer layer 308'. In some embodiments, the transistor structure 19 is a top-gated transistor structure.

Referring to FIG. 20, a transistor structure 20 similar to the transistor structure 19 is illustrated. The transistor structure 20 includes the material layer 302 disposed directly on the substrate 300 and a stack structure 16" disposed directly on and over the strip fin pattern SF of the material layer 302. In some embodiments, the stack structure 16" incudes a first heat transfer layer 304", a channel material layer 306", a second heat transfer layer 308" and a gate dielectric layer 309 sequentially stacked from the bottom to the top. In some embodiments, the transistor structure 20 includes source and drain terminals 310 disposed directly on the first heat transfer layer 304" penetrating through the gate dielectric layer 309, the second heat transfer layer 308", and the channel material layer 306". In some embodiments, the channel material layer 306" located between the source and drain terminals 310 functions as the channel region CR (channel layer) of the transistor, and the source and drain terminals 310 are electrically connected (e.g. side-contacted or edge-contacted) with the channel region CR. In some embodiments, the transistor structure 20 includes a gate structure 320 located on top of the stack structure 16" and in contact with the gate dielectric layer 309. In one embodiment, the second heat transfer layer 308" may be skipped, and the gate dielectric layer 309 is located directly on the channel material layer 306".

As described above, through the heat transfer layer having high thermal conductivity, the arrangement of the heat transfer layer between the substrate and the channel layer CR further enhances the heat dissipating ability of the device and improves the device performance. In addition, better heat dissipation can be achieved when the source and drain terminals 310 are edge-contacted with the channel layer CR and are landed directly on the heat transfer layer, and the heat generated during operation may be dissipated through the heat transfer layer located underneath the source and drain terminals.

In the exemplary embodiments, the existence of one or more heat transfer layers below the channel material layer and between the channel layer and the source and drain terminals leads to better heat dissipation efficiency for the source and drain terminals and for the device. Overall, the performance of the semiconductor device is enhanced.

In some embodiments of the present disclosure, a semiconductor device is described. The semiconductor device includes a first heat transfer layer disposed over a substrate, a channel material layer, a gate structure and source and drain terminals. The channel material layer has a first surface and a second surface opposite to the first surface, and the channel material layer is disposed on the first heat transfer layer with the first surface in contact with the first heat transfer layer. The gate structure is disposed above the channel material layer. The source and drain terminals are in contact with the channel material layer and located at two opposite sides of the gate structure.

In some embodiments of the present disclosure, a semiconductor device is described. The semiconductor device includes a heat transfer layer, a channel layer, a gate structure, a gate dielectric layer and a source and a drain. The heat transfer layer includes boron nitride. The channel layer is disposed on the heat transfer layer, and the channel layer includes a low-dimensional material. The gate structure is disposed over the channel layer, and the gate dielectric layer disposed between the gate structure and the channel layer. The source and the drain are disposed beside the gate structure and contact the channel layer.

In some embodiments of the present disclosure, a method for forming a semiconductor device is described. A heat transfer layer is formed over a substrate. A channel material layer is formed on the heat transfer layer. A dielectric layer is formed on the channel material layer. The dielectric layer is patterned to form openings in the dielectric layer. Source and drain terminals are formed in the openings. A gate structure is formed over the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a heat transfer layer over a substrate;

forming a channel material layer on the heat transfer layer, wherein the channel material layer and the heat transfer layer are made of different materials, the channel material layer includes a semiconducting two-dimensional (2D) material, and the heat transfer layer includes an insulating 2D material;

forming a dielectric layer on the channel material layer;

patterning the dielectric layer to form openings in the dielectric layer;

forming source and drain terminals in the openings; and forming a gate structure.

2. The method of claim 1, wherein forming a heat transfer layer includes performing a chemical vapor deposition process to form multilayers of boron nitride.

3. The method of claim 1, wherein forming a channel material layer includes performing a chemical vapor deposition process selectively forming at least one monolayer of a transition metal dichalcogenide (TMD) selected from $MoS_2$, $WS_2$, or $WSe_2$.

4. The method of claim 1, wherein the source and drain terminals are formed in the openings penetrating through the dielectric layer and contacting the channel material layer.

5. The method of claim 1, wherein the source and drain terminals are formed in the openings penetrating through the dielectric layer and the channel material layer and landing on the heat transfer layer.

6. The method of claim 1, further comprising forming an insulating material fin pattern on the substrate before forming the heat transfer layer.

7. The method of claim 6, wherein the source and drain terminals are formed in the openings penetrating through the dielectric layer, the channel material layer, the heat transfer layer and the insulating material fin pattern.

8. A method for forming a semiconductor device, comprising:

forming a first heat transfer layer disposed over a substrate;

forming a channel material layer on the first heat transfer layer, wherein the channel material layer has a first surface in contact with the first heat transfer layer and a second surface opposite to the first surface, the channel material layer includes a semiconducting two-dimensional (2D) material, and the first heat transfer layer includes an insulating 2D material;

forming a gate structure disposed above the channel material layer; and forming source and drain terminals in contact with the channel material layer and located at two opposite sides of the gate structure.

9. The method of claim 8, wherein the source and drain terminals are formed in openings penetrating through channel material layer and are formed on the first heat transfer layer.

10. The method of claim 8, further comprising forming a second heat transfer layer on the channel material layer and in contact with the second surface of the channel material layer before forming the gate structure, wherein the source and drain terminals are formed in openings penetrating through the second heat transfer layer and the channel material layer and are formed on the first heat transfer layer.

11. The method of claim 8, wherein the source and drain terminals are formed directly on the channel material layer.

12. The method of claim 8, further comprising a second heat transfer layer disposed on the channel material layer and in contact with the second surface of the channel material layer, wherein the source and drain terminals are formed in openings penetrating through the second heat transfer layer and are formed on the channel material layer.

13. The method of claim 8, further comprising forming a material layer between the first heat transfer layer and the substrate, wherein the material layer is formed with a fin pattern, and the first heat transfer layer and the channel material layer cover sidewalls and a top surface of the fin pattern.

14. The method of claim 8, wherein the channel material layer is formed with a material including a transition metal dichalcogenide (TMD) denoted as $MX_2$, where M is a molybdenum (Mo) or tungsten (W) and X is sulfur (S), selenium (Se) or tellurium (Te).

15. The method of claim 8, wherein forming a heat transfer layer includes performing a chemical vapor deposition process to form multilayers of boron nitride.

16. A method of manufacturing a semiconductor device, comprising:

forming a heat transfer layer over a substrate;

forming a channel material layer on the heat transfer layer, wherein the channel material layer and the heat transfer layer are made of different two-dimensional (2D) materials with an interface between the channel material layer and the heat transfer layer;

forming a dielectric layer with openings on the channel material layer;

forming source and drain terminals in the openings to be in contact with the channel material layer; and forming a gate structure.

17. The method of claim 16, wherein the channel material layer includes a semiconducting 2D material, and the heat transfer layer includes an insulating 2D material.

18. The method of claim 17, wherein forming a heat transfer layer includes performing a chemical vapor deposition process to form multilayers of the insulating 2D material and transferring the multilayers of the insulating 2D material over the substrate.

19. The method of claim 17, wherein forming a channel material layer includes performing a chemical vapor deposition process selectively forming at least one monolayer of the semiconducting 2D material and transferring the at least one monolayer of the semiconducting 2D material on the heat transfer layer.

20. The method of claim 17, wherein forming a channel material layer includes performing a growth process forming at least one monolayer of the semiconducting 2D material on the heat transfer layer.

* * * * *